(12) United States Patent
Kurihara

(10) Patent No.: US 9,502,460 B2
(45) Date of Patent: Nov. 22, 2016

(54) PHOTOELECTRIC CONVERSION ELEMENT AND METHOD OF MANUFACTURING THE SAME

(71) Applicant: CANON KABUSHIKI KAISHA, Tokyo (JP)

(72) Inventor: Masaki Kurihara, Koza-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/680,291

(22) Filed: Apr. 7, 2015

(65) Prior Publication Data
US 2015/0303226 A1    Oct. 22, 2015

(30) Foreign Application Priority Data

Apr. 18, 2014   (JP) ................. 2014-086800

(51) Int. Cl.
*H01L 21/302*    (2006.01)
*H01L 21/461*    (2006.01)
*H01L 27/146*    (2006.01)

(52) U.S. Cl.
CPC ... *H01L 27/14685* (2013.01); *H01L 27/14625* (2013.01); *H01L 27/14643* (2013.01)

(58) Field of Classification Search
CPC ............ H01L 21/31116; H01L 21/67069; H01L 21/762; H01L 21/467; H01L 21/475; H01L 21/3081; H01L 21/048; H01L 21/28158; H01L 27/146; H01L 27/305; H01L 27/14687; H01L 27/14621; H01L 27/0814; H01L 28/57; H01L 29/6603; H01L 51/5296; H01L 51/102

USPC ....... 438/91, 99, 141, 106, 70, 75, 328, 487, 438/637, 636, 706, 474; 257/79, 292, 293, 257/E21.006, E21.023, E21.045, E21.053, 257/E21.058, E21.061, E21.084, E21.229, 257/E21.259, E21.314, E21.319, E21.352
See application file for complete search history.

(56) References Cited

U.S. PATENT DOCUMENTS

| | | | | |
|---|---|---|---|---|
| 7,687,326 | B2 * | 3/2010 | Morisue | H01L 27/14621 438/149 |
| 7,977,669 | B2 * | 7/2011 | Yukawa | G11C 13/0014 257/40 |
| 8,238,700 | B2 * | 8/2012 | Asai | G02B 6/43 385/14 |
| 8,268,058 | B2 * | 9/2012 | Wu | B03C 3/09 95/78 |
| 8,546,683 | B2 * | 10/2013 | Okada | B32B 17/06 136/256 |

(Continued)

FOREIGN PATENT DOCUMENTS

| | | |
|---|---|---|
| JP | 6-302845 A | 10/1994 |
| JP | 2002-261261 A | 9/2002 |

(Continued)

*Primary Examiner* — David Nhu
(74) *Attorney, Agent, or Firm* — Fitzpatrick, Cella, Harper & Scinto

(57) ABSTRACT

A method of manufacturing a photoelectric conversion element including a step of forming a layer containing an organic material and particles dispersed in the organic material on a member including a photoelectric conversion portion and a step of roughening a surface of the layer by dry etching.

20 Claims, 4 Drawing Sheets

(56) References Cited

U.S. PATENT DOCUMENTS 8,927,321 B2 * 1/2015 Nakatani ............... H01L 27/305
  438/66
2010/0148294 A1 6/2010 Fujii et al.

FOREIGN PATENT DOCUMENTS

JP 2009-283902 A 12/2009
JP 2012-204402 A 10/2012

* cited by examiner

PHOTOELECTRIC CONVERSION ELEMENT AND METHOD OF MANUFACTURING THE SAME

BACKGROUND OF THE INVENTION

1. Field of the Invention

The present invention relates to a photoelectric conversion element and a method of manufacturing the photoelectric conversion element.

2. Description of the Related Art

A pixel array portion of a photoelectric conversion element, in which photodiodes are arranged, includes regions which light enters and light-shielded regions. Each light-shielded region is also called an optical black region (OB), which is used as a region for generating a signal as a reference for an image sensor. Some light-shielded regions have unevenness formed on their surfaces. Japanese Patent Laid-Open No. 2012-204402 discloses a technique of forming an uneven surface by etching a region above a light-shielded region simultaneously with the etching of the surface of an image sensor for the formation of openings in pad portions for interconnection. According to Japanese Patent Laid-Open No. 2012-204402, since the surface of a light-shielded region is made of the same material as that for a microlens, it has been impossible to find etching conditions suitable for the formation of unevenness on the surface by etching. In order to form unevenness on the surface by etching, the number of steps increases, including preparing a resist mask on a microlens portion, resulting in the prolongation of the etching process.

SUMMARY OF THE INVENTION

The present invention can provide a photoelectric conversion element which reduces the influence of the reflection of light by the surface of a layer above the photoelectric conversion element and a method of manufacturing the photoelectric conversion element.

According to an aspect of the present invention, there is provided a method of manufacturing a photoelectric conversion element comprising a step of forming a layer containing an organic material and particles dispersed in the organic material on a member including a photoelectric conversion portion and a step of roughening a surface of the layer by dry etching.

Further features of the present invention will become apparent from the following description of exemplary embodiments with reference to the attached drawings.

DESCRIPTION OF THE EMBODIMENTS

First Embodiment

Figure 1A:
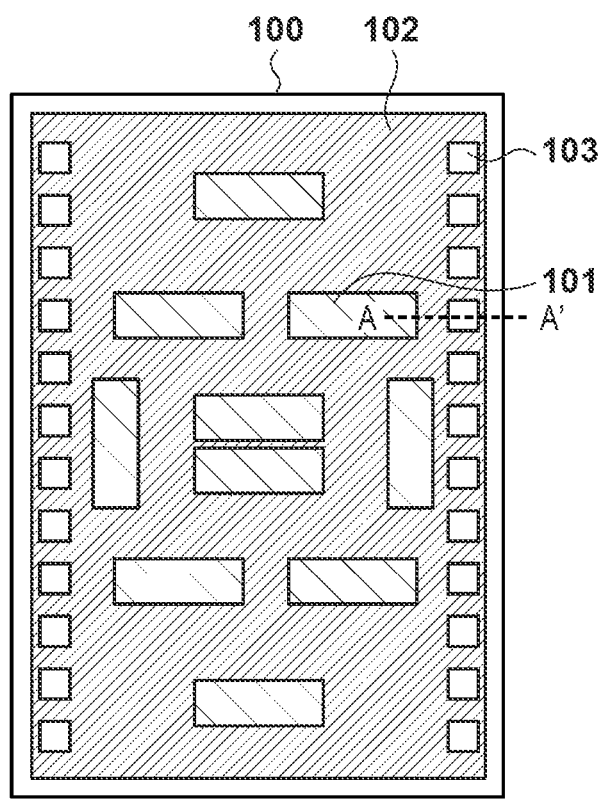
FIGS. 1A and 1B are schematic views of a photoelectric conversion element.
Figure 1B:
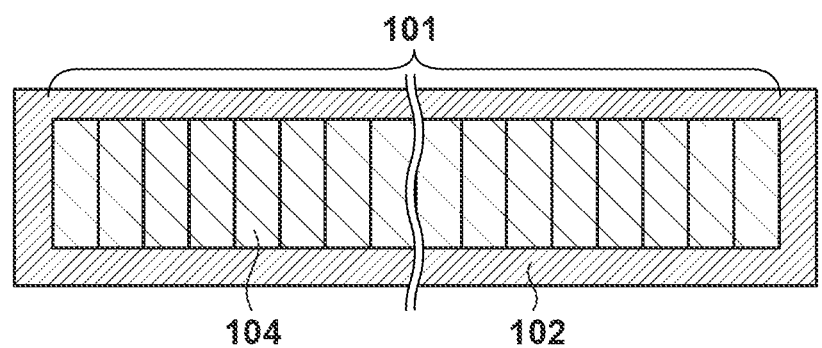

A photoelectric conversion element according to this embodiment will be described with reference to FIGS. 1A and 1B. A photoelectric conversion element 100 includes photoelectric conversion regions 101, in each of which photoelectric conversion portions are arranged, an antireflection region 102, and electrode pad regions 103 in which electrode pads are arranged. Each photoelectric conversion portion converts light into an electrical signal. The antireflection region 102 is provided on the surface of the photoelectric conversion element 100, which light enters, except for the photoelectric conversion regions 101 and the electrode pad regions 103. The antireflection region 102 is covered with an antireflection layer (to be described later). The antireflection region 102 includes, for example, regions where the photoelectric conversion portions are partly light-shielded and regions where peripheral circuit portions and the like are arranged, which perform driving for reading out signals from photoelectric conversion portions and process readout signals. For example, as shown in FIG. 1B, each photoelectric conversion region 101 according to this embodiment is an AF sensor or image sensor in which a plurality of photoelectric conversion portions 104 are one-dimensionally arranged.

Figure 2:
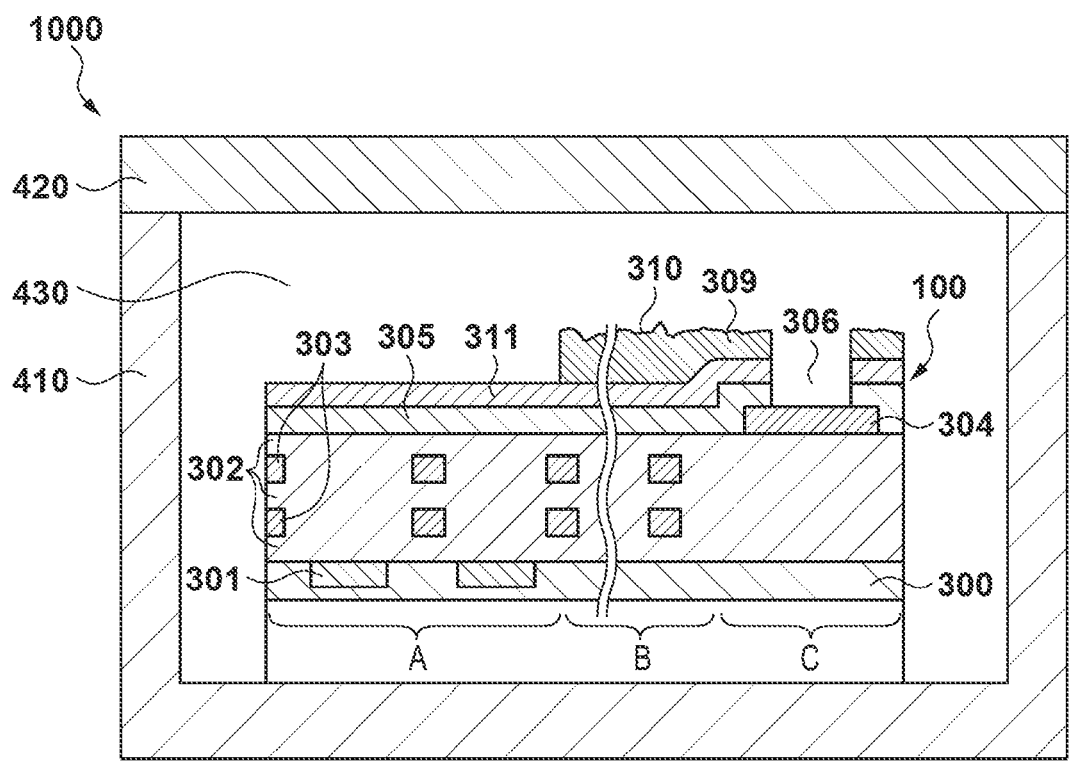
FIG. 2 is a schematic view of a photoelectric conversion device.

A photoelectric conversion device including the photoelectric conversion element according to this embodiment will be described next with reference to FIG. 2. FIG. 2 is a sectional view of part of the photoelectric conversion element 100 which corresponds to a line A-A' in FIG. 1A. FIG. 2 shows a member having an interlayer insulation film 302, interconnections 303, and the like formed on a semiconductor substrate 300 in which photoelectric conversion portions 301, peripheral circuits (not shown), and the like are formed. For the sake of descriptive convenience, this member is divided into three regions A, B, and C, as shown in FIG. 2. The region A is a region in which a plurality of photoelectric conversion portions 301 such as photodiodes are formed in the semiconductor substrate 300 and which has an opening through which light enters. The region B is a region in which the following are formed: optical black portions (OB portions) where the photoelectric conversion portions 301 are partly light-shielded; driving circuits for reading out signals from the photoelectric conversion portions 301; peripheral circuit portions for processing readout signals; and the like. The region C is a region in which an electrode pad 304 is arranged on the surface of the interlayer insulation film 302. The region A corresponds to the photoelectric conversion region 101. The region B corresponds to the antireflection region 102 in FIG. 1A. The region C corresponds to the electrode pad region 103 in FIG. 1A.

A passivation layer 305 is provided on the surface of the interlayer insulation film 302. An antireflection layer 309 is formed on a planarizing layer 311 on the passivation layer 305. The antireflection layer 309 is a layer containing an organic material such as a resin and particles dispersed in the organic material. The surface of the antireflection layer 309 is a rough surface 310. The antireflection layer 309 has a surface roughness of 50 nm or more in RMS. The antireflection layer 309 can form the surface layer of the photoelectric conversion element 100. However, the photoelectric conversion element 100 may further have a color filter layer, microlens layer, planarizing layer, and the like on the antireflection layer 309.

As shown in FIG. 2, the photoelectric conversion element 100 housed in a package is used as a photoelectric conversion device 1000. As a type of package, it is possible to use a package having a space formed by a base member 410 having a concave portion (cavity) and a lid member 420 sealing the concave portion as in this case. In the package having the space, the photoelectric conversion element 100 is mounted in the concave portion of the base member 410, and a space 430 is formed between the photoelectric conversion element 100 and the lid member 420. The surface, of the photoelectric conversion element 100, which light enters faces the space 430. In this case, the rough surface 310 of the surface of the antireflection layer 309 also faces the space 430. As a type of package, it is also possible to use a package encapsulating the photoelectric conversion element 100 with a transparent resin. It is possible to form an image capturing system such as a camera by using the photoelectric conversion device 1000 upon mounting it on a circuit board or on a holding member for the facilitation of handling.

The antireflection layer 309 has opening portions in portions above each photoelectric conversion portion 301 and each electrode pad 304. Each electrode pad 304 is connected to a circuit inside the photoelectric conversion element 100. When the photoelectric conversion element 100 is mounted in a package, the electrode pads 304 are used to connect the element to the terminals of the package by wire bonding. The antireflection layer 309 is made of an organic material containing dispersed particles, and its surface has been roughened. For example, in the photoelectric conversion element for focus detection, light reflected by the surface of the photoelectric conversion element and its internal interfaces is sometimes reflected by the lid member 420 and the like provided for the package of the photoelectric conversion element, and enters the photoelectric conversion portions 301 again. When the reflected light enters the photoelectric conversion portions 301, the reflected light sometimes becomes noise, resulting in a focus error. The antireflection layer 309 shields incident light by absorption and/or scattering. In addition, the antireflection layer 309 has a function of reducing operation errors caused by reflected light by reducing reflection by absorbing and scattering light reflected by the interfaces inside the photoelectric conversion element 100.

A method of manufacturing the photoelectric conversion element 100 according to this embodiment will be described with reference to FIGS. 3A to 3D. First of all, a member is prepared, which has the interlayer insulation film 302, the interconnections 303, and the like formed on the semiconductor substrate 300 in which the photoelectric conversion portions 301, peripheral circuits (not shown), and the like are formed. The passivation layer 305 is formed on the surface of the interlayer insulation film 302. Thereafter, the passivation layer 305 formed in the region where the electrode pads 304 are arranged is selectively etched, thereby forming openings 306 to expose the upper portions of the electrode pads 304.

Figure 3A:
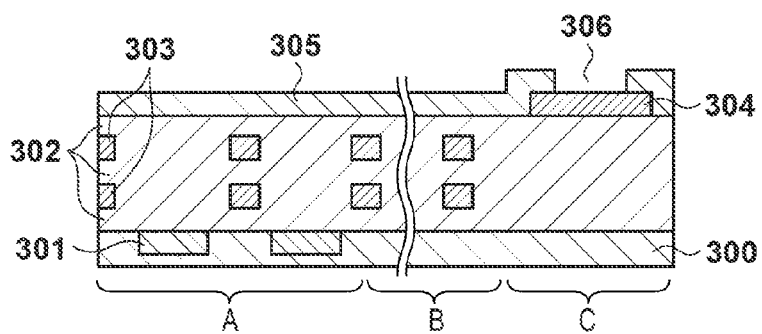
FIGS. 3A to 3D are views for exemplarily explaining a method of manufacturing a photoelectric conversion element according to the first embodiment.
Figure 3B:
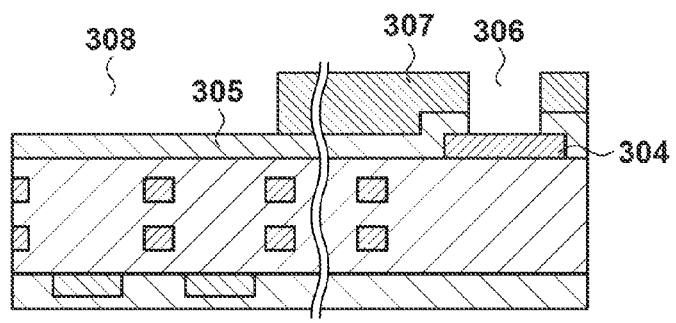

As shown in FIG. 3B, a dispersion layer 307 is formed on a region other than an opening 308 above the region A where the plurality of photoelectric conversion portions 301 are arranged and the opening 306 above the electrode pad 304 in the region C. The dispersion layer 307 is a layer containing an organic material such as a resin and particles dispersed in the organic material. In the dispersion layer 307, the organic material serves as a dispersion medium, and the particles serve as a dispersoid. Particles as a dispersoid can be made of a pigment. The dispersion layer 307 containing particles is formed as follows. First of all, the passivation layer 305 is coated with a photosensitive liquid organic material dispersed with particles. An organic material film as a coating film of the organic material is formed through a drying process and the like. This organic material film is formed into a predetermined pattern by exposure and subjected to a developing process, thereby forming the dispersion layer 307 by a photolithography technique. In this patterning process, the opening 306 is formed by removing a portion of the organic material film which is located on the electrode pad 304. In addition, the opening 308 is formed by removing a portion of the organic material film which is located on the photoelectric conversion portions 301. In the above manner, the dispersion layer 307 is formed on a portion other than the opening 308 above each photoelectric conversion portion 301 and the opening 306 above each electrode pad 304. The dispersion layer 307 contains the organic material as the cured liquid organic material and the particles dispersed in the organic material.

Figure 3C:
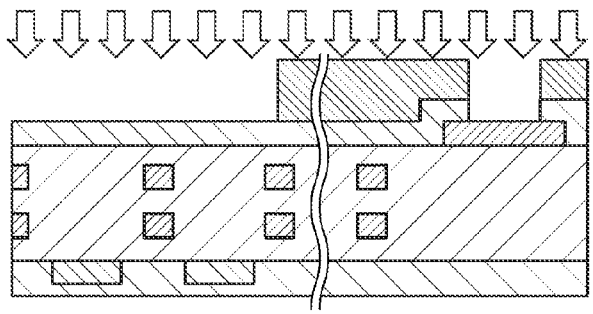

As an organic material, for example, an acrylic resin can be used. In addition, as a pigment, either an organic pigment or an inorganic pigment can be used. A colored pigment, especially a blue or black pigment, is advantageous in absorbing reflected light. The material of the particles contained in the dispersion layer 307 is not limited to a pigment and may be silica, titania, or alumina. Subsequently, as shown in FIG. 3C, a roughening process is performed on the patterned upper surface of the dispersion layer 307 containing particles by dry etching. Etching conditions were set as follows:

pressure: 15 mTorr
high-frequency power: 500 W
etching gases: $CF_4/O_2$=100/10 sccm
time: 60 sec Etching conditions may be used as follows: a pressure in the range of 1 mTorr to 100 mTorr, a high-frequency power in the range of 100 W to 1,000 W, and the flow rates of $CF_4$ and $O_2$ as etching gases in the range of 0 sccm to 500 sccm and in the range of 1 sccm to 500 sccm, respectively.

Figure 3D:
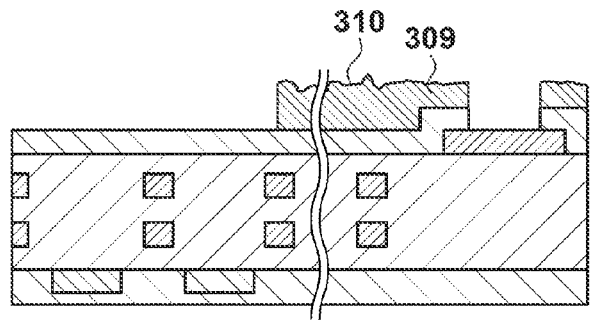

The passivation layer 305 and the electrode pad 304 block etching on the regions corresponding to the opening 308 on the photoelectric conversion portions 301 and the opening 306 on the electrode pad. However, as shown in FIG. 3D, the upper surface of the dispersion layer 307 formed from an organic material containing particles is roughened by etching to form the uneven rough surface 310. This forms the antireflection layer 309 having the rough surface 310. When the surface roughness of the roughened antireflection layer 309 was measured by L-traceII (atomic force microscope) available from SII Nano Technology, the result was 60.7 nm in RMS (root-mean-square). Note that the surface roughness of the dispersion layer 307 before the roughening process was 43.5 nm. In the above manner, a photoelectric conversion element was manufactured, which has, as part of its surface, the rough surface 310 formed from particles and an organic material by roughening. The surface roughness of the rough surface 310 of the antireflection layer 309 suitable to reduce the reflection of light by the interface can be set to 50 nm or more in RMS. It is effective to perform such a roughening process to the dispersion layer 307 having a surface roughness less than 50 nm in RMS. In order to realize such surface roughness, the particle size of particles contained in an organic material can be set to 30 nm to 100 nm in median size. Using an organic material containing particles can increase the etching selectivity and facilitate forming an uneven surface. For example, in dry etching, the organic material is etched more easily than the particles because of the etching selectivity difference. For this reason, the dispersed particles are exposed on the surface of the dispersion layer 307. The shape of each particle enhances the unevenness to obtain sufficient unevenness for antireflection. For this reason, the rough surface 310 of the antireflection layer 309 can be formed such that both the particles and the organic material are exposed.

According to this embodiment, an organic material dispersed with particles is used as a material for the formation of the antireflection layer 309. This makes it possible to effectively perform a roughening process by etching, and improves the antireflection effect. In the embodiment, the rough surface is formed on the uppermost surface of the photoelectric conversion element. However, the rough surface may be covered with a planarizing layer or transparent material. As an organic material containing a pigment, an organic material used for a color filter can be used. In this case, when forming a color filter, it is possible to form a layer using the same material as that for the color filter in a region where an antireflection layer is formed and form an antireflection layer by roughening the surface of the region serving as the antireflection layer by selective etching. In addition, microlenses and a transparent layer may be arranged on the antireflection layer.

Second Embodiment

Figure 4A:
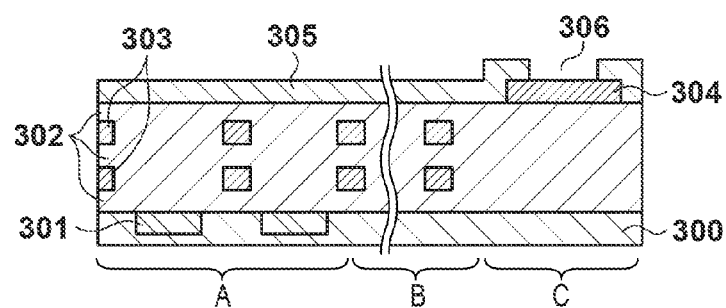
FIGS. 4A to 4E are views for exemplarily explaining a method of manufacturing a photoelectric conversion element according to the second embodiment.

The second embodiment will be described next with reference to FIGS. 4A to 4E. FIG. 4A to 4E are sectional views of part of a photoelectric conversion element 100 corresponding to a line A-A' in FIG. 1. The same reference numerals as in the first embodiment denote the same components, and a repetitive description of them will be omitted. As shown in FIG. 4A, similar to the first embodiment, a member is prepared, which has an interlayer insulation film 302, interconnections 303, and the like formed on a semiconductor substrate 300 on which photoelectric conversion portions 301, peripheral circuits (not shown), and the like are formed. A passivation layer 305 is then formed on the member. Thereafter, an opening 306 is formed.

Figure 4B:
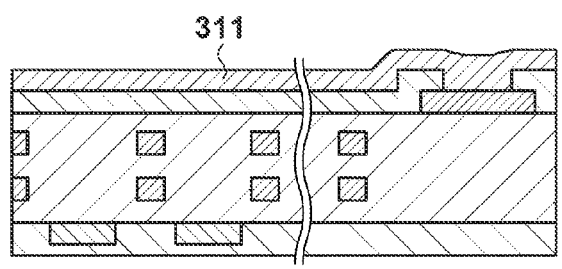

As shown in FIG. 4B, a planarizing layer 311 is formed on the passivation layer 305. The planarizing layer 311 according to this embodiment was formed by coating the surface with an acrylic resin by spin coating and baking it. At this time, the surface roughness of the planarizing layer 311 was 13.5 nm in RMS.

Figure 4C:
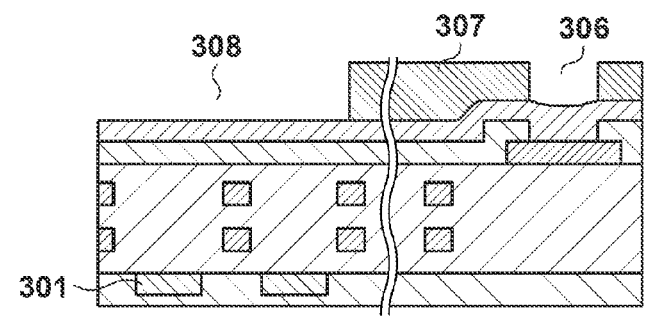

As shown in FIG. 4C, a dispersion layer 307 containing particles of a pigment or the like was then formed on a region other than an opening 308 above a region A where the photoelectric conversion portions 301 were arranged and the opening 306 above an electrode pad 304 in a region C. More specifically, as in the first embodiment, coating, exposure, and developing of an organic material were performed, and the resultant layer was patterned to form the dispersion layer 307 on a portion other than the opening 308 on photoelectric conversion portions and the opening 306 on the electrode pad.

Figure 4D:
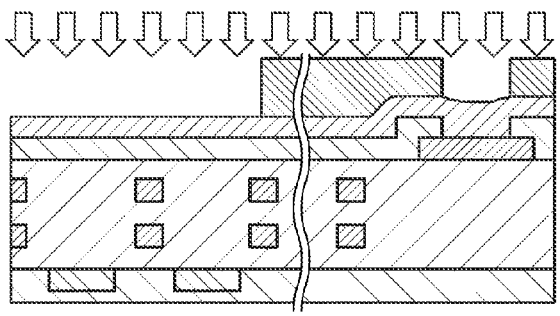

As shown in FIG. 4D, dry etching was then performed. The surface of the dispersion layer 307 containing a pigment was subjected to a roughening process by etching. At the same time as the roughening process, the planarizing layer 311 as an under layer exposed to the bottom portions of the openings 308 and 306 was removed by etching using the dispersion layer 307 as a mask. Note that etching conditions were set as follows:

pressure: 15 mTorr
high-frequency power: 500 W
etching gases: $O_2/N_2/Ar=80/20/100$ sccm
time: 60 sec Etching conditions may be set as follows: a pressure in the range of 1 mTorr to 100 mTorr, a high-frequency power in the range of 100 W to 1,000 W, and the flow rates of $O_2$, $N_2$, and Ar as etching gases in the range of 0 sccm to 100 sccm, in the range of 1 sccm to 50 sccm, and in the range of 1 sccm to 200 sccm, respectively.

Figure 4E:
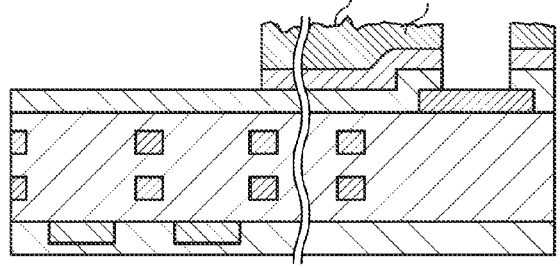

As shown in FIG. 4E, the upper surface of the organic material containing a pigment after a roughening process is roughened to form the rough surface 310. When the surface roughness of the roughened dispersion layer 307 was measured by L-traceII (atomic force microscope) available from SII Nano Technology, the result was 65.2 nm in RMS. In the above manner, a photoelectric conversion element was manufactured, which partly has a surface roughened by an organic material containing particles such as a pigment.

The types of gases used for etching in this embodiment differ from those in the first embodiment. In the second embodiment, the planarizing layer 311 is formed on the passivation layer 305. When removing the planarizing layer on each electrode pad by etching simultaneously with a roughening process on the surface of an organic material containing a pigment, it is necessary to sufficiently perform over-etching to completely remove the planarizing layer 311 on each electrode pad. Using, as a gas for etching in this embodiment, a gas mixed with a CF-based gas as in the first embodiment can suppress the possibility that the passivation layer on each electrode pad or each photoelectric conversion portion may be etched.

In this embodiment, an organic material containing particles which absorb light was used for an antireflection layer, and a roughening process was performed on the upper surface of a dispersion layer to form fine unevenness on the upper surface, thereby improving the antireflection effect. In addition, in the embodiment, a planarizing layer is arranged on a passivation layer. If there is a large difference in level caused by an interconnection layer or the like below a passivation layer, a striation may be formed without any planarizing layer at the time of spin coating with an organic material containing a pigment. This may cause unevenness in antireflection effect and reduce the antireflection effect. Furthermore, if the adhesiveness between a passivation layer and an organic material containing particles such as a pigment is low, film peeling may occur. Such a problem can be suppressed by arranging a planarizing layer on a passivation layer.

In addition, when removing a planarizing layer by etching, an organic material containing particles facilitates etching because the etching selectivity of the organic material is high with respect to the planarizing layer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-086800, filed Apr. 18, 2014, which is hereby incorporated by reference herein in its entirety.

What is claimed is:

1. A method of manufacturing a photoelectric conversion element, the method comprising:
    preparing a member including a photoelectric conversion portion;
    forming a layer containing an organic material and particles dispersed in the organic material on the member; and
    exposing the particles on a surface of the layer by dry etching so as to form a roughness of the surface of the layer.

2. The method according to claim 1, wherein the layer is formed by forming a film dispersed with the particles on the member and then patterning the film.

3. The method according to claim 2, wherein the film has photosensitivity and is patterned by exposing and developing the film.

4. The method according to claim 2, wherein the film is formed by coating the member with an organic material dispersed with the particles.

5. The method according to claim 1, wherein the dry etching is performed at a pressure in a range of 1 mTorr to 100 mTorr and a high-frequency power in a range of 100 W to 1,000 W by using, as etching gases, $CF_4$ at a flow rate of 0 sccm to 500 sccm and $O_2$ at a flow rate of 1 sccm to 500 sccm.

6. The method according to claim 1, further comprising forming an under layer, wherein the dry etching is performed to etch the under layer of the layer by using the layer as a mask.

7. The method according to claim 1, wherein the dry etching is performed at a pressure in a range of 1 mTorr to 100 mTorr and a high-frequency power in a range of 100 W to 1,000 W by using, as etching gases, $O_2$ at a flow rate of 0 sccm to 100 sccm, $N_2$ at a flow rate of 1 sccm to 50 sccm, and Ar at a flow rate of 1 sccm to 200 sccm.

8. A photoelectric conversion element comprising:
a semiconductor substrate including a photoelectric conversion portion; and
a layer provided on the semiconductor substrate, containing an organic material and particles dispersed in the organic material, and having a surface roughness of not less than 50 nm in RMS.

9. A method of manufacturing a photoelectric conversion element, the method comprising:
forming a layer containing an organic material and particles dispersed in the organic material on a member including a photoelectric conversion portion; and
roughening a surface of the layer by dry etching,
wherein the layer is formed by forming a film dispersed with the particles on the member and then at least a portion of the film which is located above the photoelectric conversion portion is removed.

10. The method according to claim 1, wherein the particles are made of a pigment.

11. The method according to claim 9, wherein the film has photosensitivity and is patterned by exposing and developing the film.

12. The method according to claim 9, wherein the film is formed by coating the member with an organic material dispersed with the particles.

13. The method according to claim 9, wherein the particles are made of a pigment.

14. The method according to claim 9, wherein a particle size of the particles is 30 nm to 100 nm in median size.

15. The method according to claim 1, wherein an etching selectivity of the organic material is different from an etching selectivity of the particles.

16. The photoelectric conversion element according to claim 8, wherein the layer forms a surface of the photoelectric conversion element.

17. The photoelectric conversion element according to claim 8, wherein the particles are made of a pigment.

18. The photoelectric conversion element according to claim 8, wherein the layer has an opening located above the photoelectric conversion portion.

19. The photoelectric conversion element according to claim 8, wherein a particle size of the particles is 30 nm to 100 nm in median size.

20. The method according to claim 1, wherein a particle size of the particles is 30 nm to 100 nm in median size.

* * * * *